US009263299B2

(12) United States Patent  
van Gemert et al.

(10) Patent No.: US 9,263,299 B2
(45) Date of Patent: Feb. 16, 2016

(54) EXPOSED DIE CLIP BOND POWER PACKAGE

(71) Applicant: NXP B.V., Eindhoven (NL)

(72) Inventors: Leonardus Antonius Elisabeth van Gemert, Nijmegen (NL); Emil Casey Israel, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/322,656

(22) Filed: Jul. 2, 2014

(65) Prior Publication Data

US 2016/0005626 A1  Jan. 7, 2016

(51) Int. Cl.
*H01L 21/00* (2006.01)
*H01L 21/48* (2006.01)
*H01L 23/495* (2006.01)
*H01L 21/56* (2006.01)

(52) U.S. Cl.
CPC ............ *H01L 21/4825* (2013.01); *H01L 21/56* (2013.01); *H01L 23/4952* (2013.01); *H01L 23/49541* (2013.01)

(58) Field of Classification Search
None
See application file for complete search history.

(56) References Cited

U.S. PATENT DOCUMENTS

| | | |
|---|---|---|
| 6,294,100 B1 | 9/2001 | Fan et al. |
| 6,646,339 B1 | 11/2003 | Ku et al. |
| 8,643,158 B2 | 2/2014 | Liu et al. |
| 2011/0198738 A1 | 8/2011 | Van De Water et al. |
| 2011/0284997 A1* | 11/2011 | Gong ................ H01L 21/568 257/666 |
| 2012/0028397 A1 | 2/2012 | Goh et al. |
| 2013/0181332 A1* | 7/2013 | Kelkar ............... H01L 23/3107 257/666 |

FOREIGN PATENT DOCUMENTS

WO   2008/114094 A1   9/2008

OTHER PUBLICATIONS

NXP B.V. Application Note AN10365, Surface Mount Reflow Soldering, Rev. 6, 31 pgs. (Jul. 2012).
Lim, F. et al. "Process Characterization of Aluminum Ribbon bond", Intl. Conf. on Electronic Materials and Packaging, pp. 1-5 (Nov. 2007).
Chia, J. et al. "Redesigns of HSOP Package for High Power Consumption Based on the Numerical Thermal Simulation Analysis", Proceedings of IPACK2005 ASME, pp. 1-6 (Jul. 2005).
Carsem Application Note. Comprehensive User's Guide, MLP Micro Leadframe Package, 20 pgs. (Apr. 2002).
Walsin Technology Corporation "SMT Notes for CHIP-R and MLCC", pp. 1-21 (2002).
Natel Engineering Co., Inc. "Quick Reference Guide: Ribbon Bond vs. Wire Bond", 2 pgs., Date Unknown.

* cited by examiner

*Primary Examiner* — Mary Wilczewski
*Assistant Examiner* — Erik T Peterson

(57) ABSTRACT

In an example embodiment, an integrated circuit (IC) comprises a device die having a top-side surface and an under-side surface, the top-side surface having bond pads connected to active circuit elements, the under-side surface having a conductive surface. A first set of lead frame clips having upper portions and lower portions, are solder-anchored, on the upper portions, to a first set of bond pads; the lower portions are flush with the conductive surface. Wires are bonded to an additional set of bond pads opposite the first set of bond pads and to lower lead frame portions of a second set of lead frame clips opposite the first set of lead frame clips; the lower lead frame portions of the second set of lead frame clips are flush with the conductive surface. The device is encapsulated in a molding compound leaving exposed the conductive surface and underside surfaces of the first and second sets of the lead frame portions.

10 Claims, 9 Drawing Sheets

EXPOSED DIE CLIP BOND POWER PACKAGE

FIELD

This disclosure relates to integrated circuit (IC) packaging. More particularly, this disclosure relates packaging with a reduced vertical profile and an exposed underside surface providing enhanced thermal performance.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Having manufactured a number of electronic devices on a wafer substrate, a particular challenge is to package these devices for their given purpose. As the complexity of portable systems increases, there is a commensurate need to reduce the size of the individual components which make up the system; the system often is laid out on a printed circuit substrate. One way to reduce the size of individual components is through techniques that reduce the size of packages which contain these devices. There is a need for packaging which reduces the amount of printed circuit substrate space consumed. Further, in reducing amount of consumed space, the power-handling capabilities of the package/device assembly must also be enhanced.

SUMMARY

The present disclosure addresses the challenge of making a semiconductor power package with minimal $R_{DSon}$ with enhanced thermal performance. This is obtained by having the backside of the die exposed in the package. The die backside has a solderable coating. In this way minimal thermal resistance is achieved between the die junction and the printed circuit board to which the packaged device is attached. The Low $R_{DSon}$ is achieved using a clip bond process to attach leads in direct die contact. Optional multiple wire bonds may be added, as well, for signal pathways not involved with the low $R_{DSon}$ requirement.

In an example embodiment, there is a method for packaging an integrated circuit (IC). The method comprises mounting a plurality of active device die, into predetermined positions, onto a temporary carrier. Each said active device die has bond pads; each of said active device die has a solderable conductive surface on its underside; and each of said device has been subjected to back-grinding to a prescribed thickness. A solder paste is dispensed onto the bond pads on the plurality active device die. A lead frame is attached to the temporary carrier, the lead frame having an array of device positions which correspond to the predetermined positions of the plurality of active device die, wherein upper lead frame portions contact the solder paste present on the bond pads and lower lead frame portions contact the temporary carrier. There is a reflowing of the solder so that a connection is made between the upper lead frame portions and the bond pads of the plurality of active device die.

In another example embodiment, there is a method for packaging an integrated circuit (IC) device from a semiconductor wafer substrate, the wafer substrate having a top-side surface with a plurality active device die defined thereon, and an under-side surface. The method comprises back-grinding the under-side surface of the wafer substrate to a prescribed thickness; applying a solderable conductive surface to the under-side surface of the wafer substrate. The plurality of active device die are separated out from the semiconductor wafer substrate, each of the active device die having bond pads, the bond pads providing electrical connection to circuit elements in the active device die and the plurality of active device die are mounted into predetermined positions onto a temporary carrier. A solder paste is dispensed onto the bond pads on the plurality active device die. Individual lead frame portions are attached to the temporary carrier and bond pads, wherein upper individual lead frame portions contact the solder paste present on the bond pads and lower individual lead frame portions contact the temporary carrier. A reflowing of the solder is performed so that a connection is made between the upper lead frame portions and the bond pads of the plurality of active device die.

In yet another example embodiment, an integrated circuit (IC) device comprises a device die having a top-side surface and an under-side surface, the top-side surface having bond pads connected to active circuit elements, the under-side surface having a solderable conductive surface. A first set of lead frame clips, having upper portions and lower portions, are solder-anchored on the upper portions, to a first set of bond pads, and the lower portions are about co-planar with the conductive surface. Wires are bonded to an additional set of bond pads opposite the first set of bond pads and to lower lead frame portions of a second set of lead frame clips opposite the first set of lead frame clips; the lower lead frame portions of the second set of lead frame clips are flush with the conductive surface. The IC device is encapsulated in a molding compound leaving the solderable conductive surface and underside surfaces of the first and second sets of the lead frame portions exposed.

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1A:
FIGS. 1A-1G are side-views of device die assembled according to an embodiment of the present disclosure.
Figure 1B:
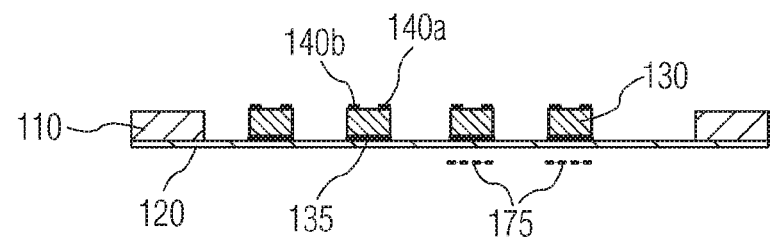
Figure 1C:
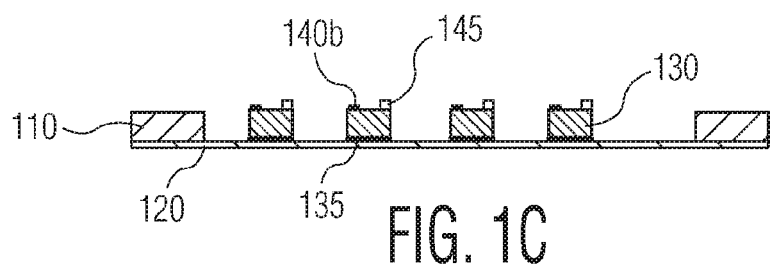

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in reducing in a FET device, in the "On" state, the drain/source electrical resistance (i.e., $R_{DSon}$). It is desirable that the $R_{DSon}$ be as low as possible so as to reduce the electrical power loss inside the package. These devices may be expected to dissipate about 100 mW to about 5 W, or more. The degree of grinding and the back side metallization affect the $R_{DSon}$ of the finished device product. In an example process the wafers are ground down to about 200 μm. To further reduce the $R_{DSon}$, in another example process, the back grind thickness may be reduced down to 50 μm, after this process the back side metallization is applied. This metallization is in the order of a few micrometers, One or more metallization deposition techniques may be applied or even a combination of them (e.g., an initial sputter layer which is increased in thickness by a plating process).

In this disclosure the die backside is coated on wafer level with a solderable back side metal (NiAu, Cu, NiAg, etc.) Any solderable finish can be used, as long as the solderabilty is not deteriorated by the processing conditions and allows storage for a sufficient period between package assembly and customer use. It is worth noting that before the solderable coating is applied to the underside surface of of the back-ground wafer, as a first layer, an adhesion layer of titanium (Ti), chromium (Cr), or other suitable material, is often applied. For example, a complete metal stack may include TiNiAg, CrNiAg, TiNiAu, CrNiAu, etc. Often the solderable coating is expressed in terms of the last two or three layers or surfaces.

In another example process, a heavily doped poly-silicon may be used in addition to a metallization to enhance conductivity and reduce $R_{DSon}$. However, the process would have to be compatible and not interfere with the operation of the finished device. After the metallization, the wafer is separated into individual dies; the dies are placed on a temporarily carrier (tape) in an array (e.g., a matrix) format with fixed pitch in X and Y direction.

Next a solder paste is applied on the low-ohmic required bond pad contacts (e.g., by screen printing or dispensing). Next a pre-formed lead frame is fixed to the carrier. In an example process, the pre-formed lead frame will exert some force on the solder paste and device. However, there should be sufficient space between the pre-formed lead frame and solder paste so as to minimize the contact resistance between the lead frame and flowed solder. The preforming is such that the part of the lead frame which forms the lead is attached on the carrier and the upward bent part of the lead frame is contacting the solder paste. After reflow the contact between die and lead frame is made. Optional additional wire bonds can be made. Molding is then done covering the total lead frame. In an alternative embodiment, single devices are individually encapsulated so that leads remain free from molding compound. After the molding process the devices can be marked and singulated as individual products by sawing or by punch singulation.

Refer to FIGS. 1A-1G and FIGS. 2A-2G. FIGS. 1A-1G illustrate in a cross-section side view X-X,' (that is, X-X' is 1A-1A,' 1B-1B,' 1C-1C,' etc.) of the corresponding FIGS. 2A-2G which are a top view perspective. A carrier tape 120 is mounted into a carrier ring apparatus 110. At predetermined device die locations 165, an array of device die 130 are bonded onto the carrier tape 120. For example, as a two-sided adhesive carrier tape, REVALPHA® tape may be used. REVALPHA is the trademark of the brand of thermal release sheet material for electronic component processing manufactured by Nitto Denko Corporation, Osaka, Japan. At room temperature, the tape adheres securely. With application of heat the tape loses its adhesion. Depending upon a particular process the tape may be selected to release at 90° C., 120° C., 150° C. or 170° C.

The undersides of device die 130 have been prepared with a solderable conductive coating 135. In example processes, carrier ring frame sizes may be 50 mm×200 mm or 80 mm×300 mm.

In an example embodiment, the carrier tape 120 actually also could be mounted on a flat plate supporting the total materials rather than a ring. This supporting plate or ring can be reused in the process so this is to be seen as tooling and not as consumable material. The number of fabricated devices can range from several hundred to even several thousand pieces. Package sizes may range from few millimeters to down to about 0.5 mm×1 mm.

Figure 1D:
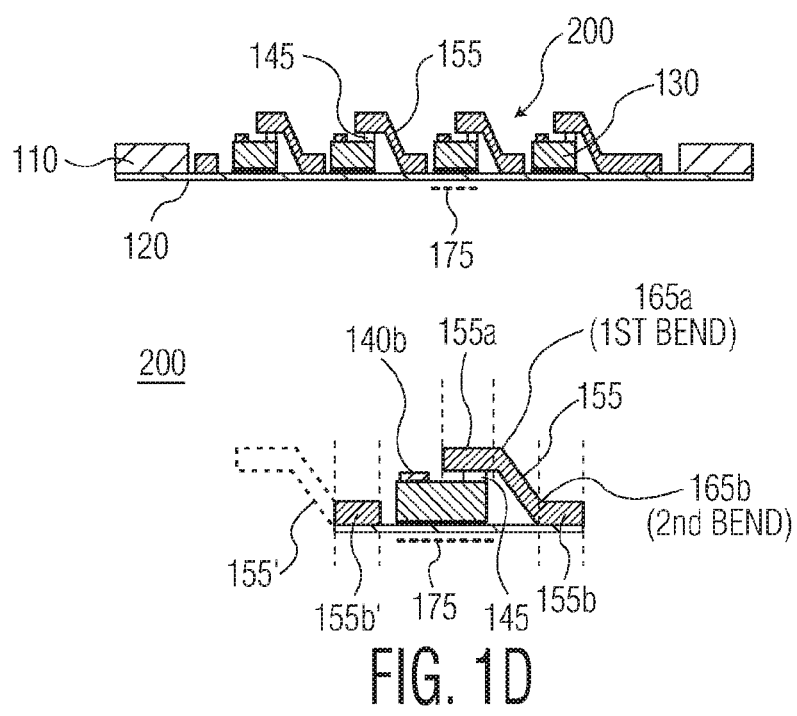
Figure 1E:
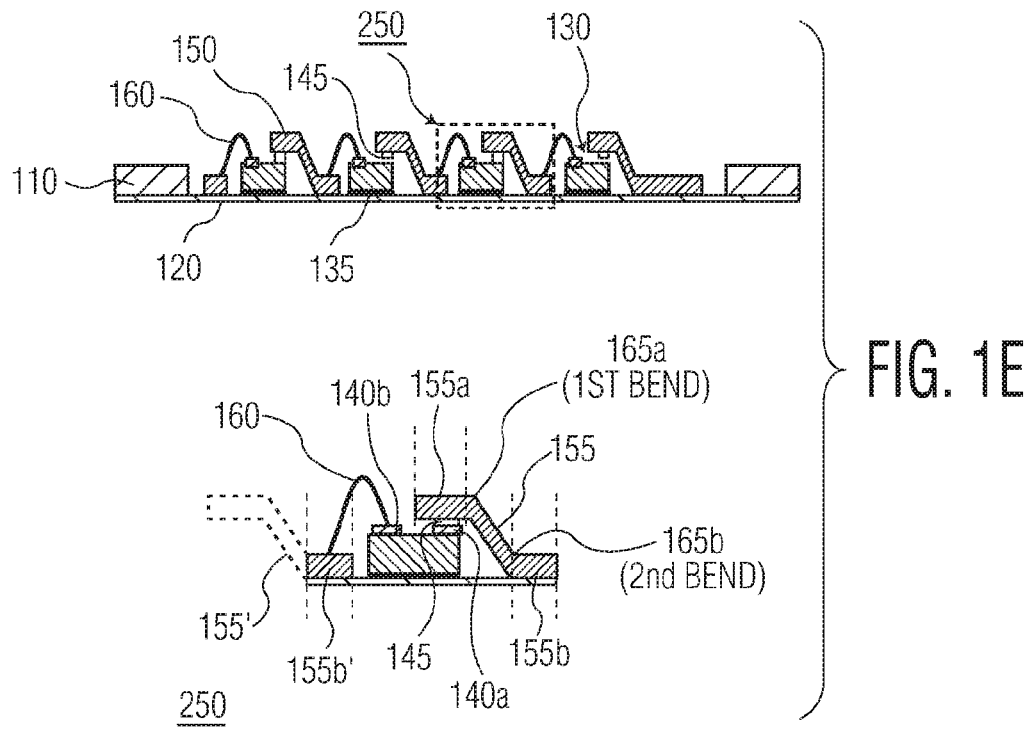
Figure 1F:
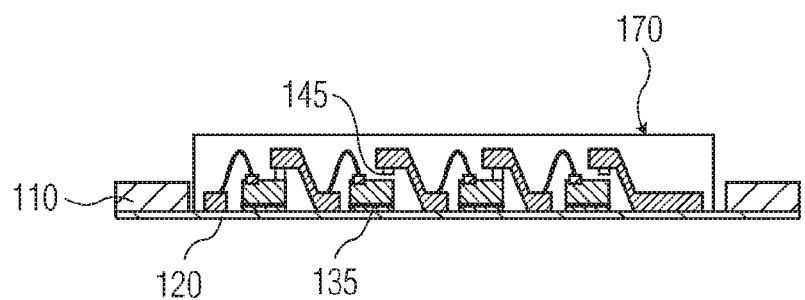
Figure 1G:
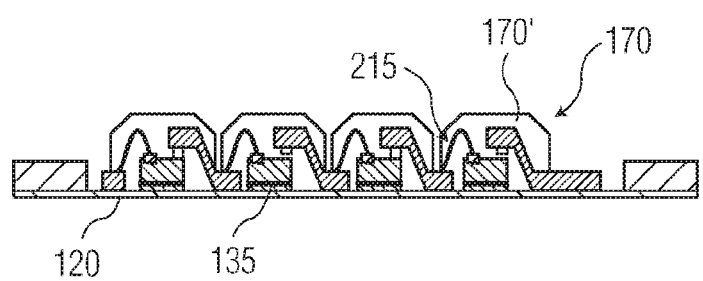
Figure 2A:
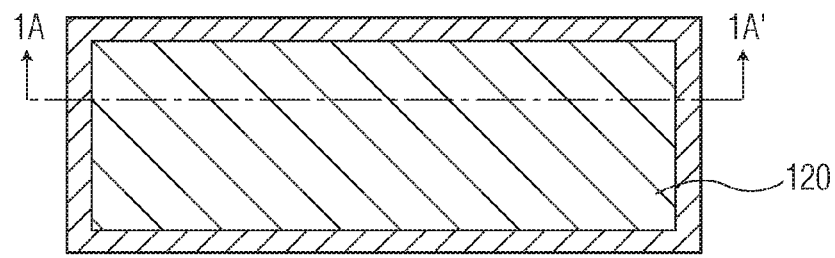
FIGS. 2A-2G are top-views of the corresponding FIGS. 1A-1G.
Figure 2B:
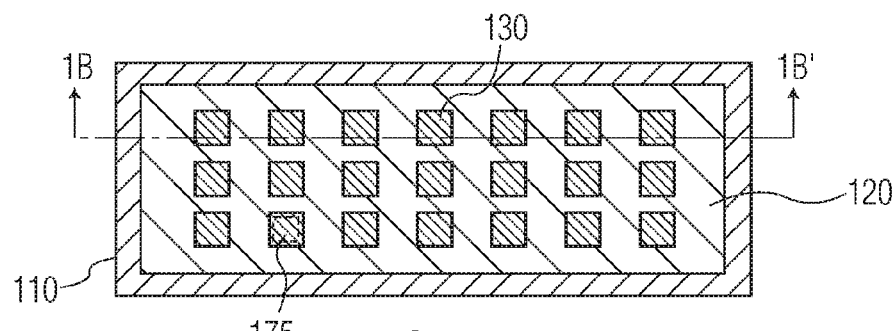
Figure 2C:
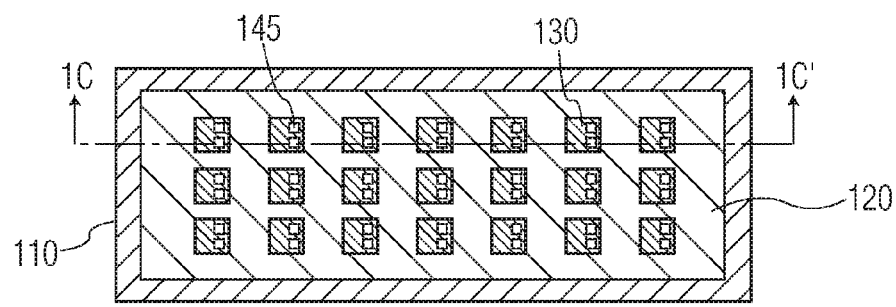
Figure 2D:
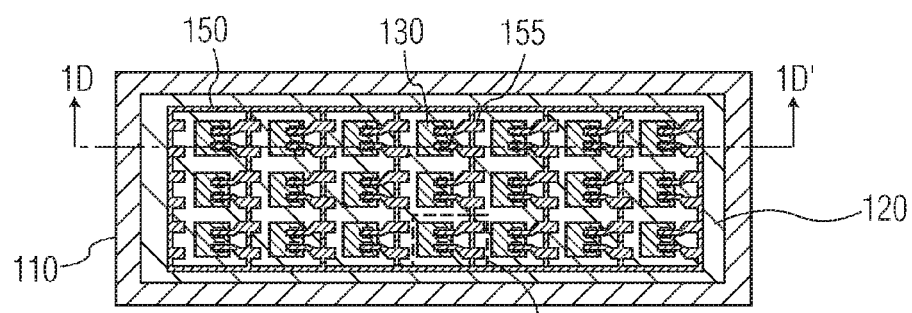
Figure 2E:
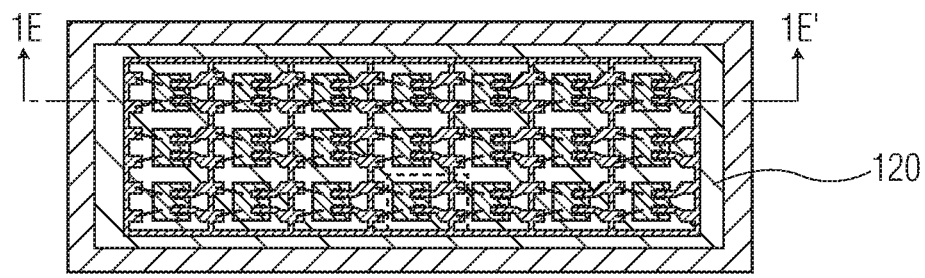
Figure 2F:
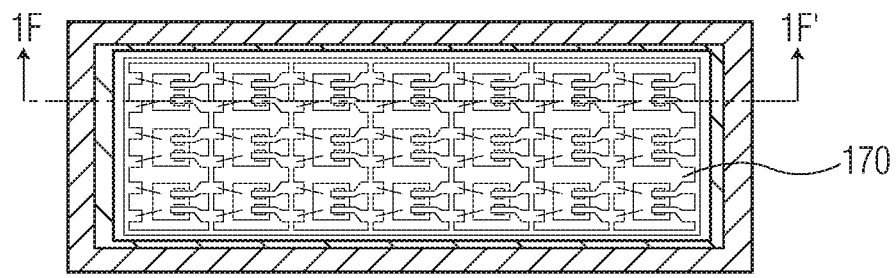
Figure 2G:
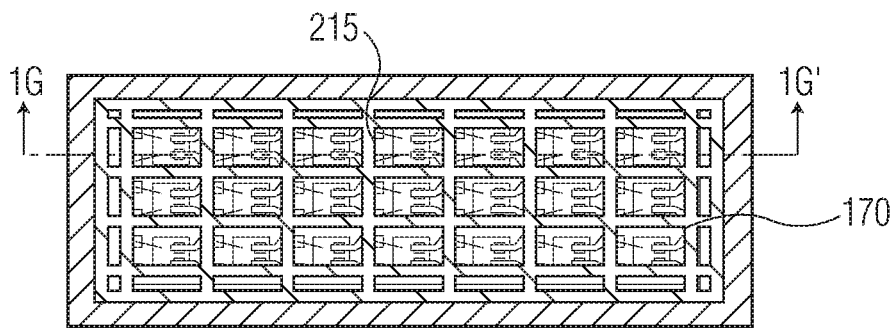

On selected device die pads 140, with a screen printing process, a solder paste 145 is dispensed (in this example, device die pad 140a). A lead frame 150 has an array of lead frame clips 155 which correspond to the device die positions 175. The lead frame 150 is mounted onto the carrier tape 120 so that a first lead frame portion 155a (of lead frame clip 155) at the device die position 175 contacts the bond pad 140a, now prepared with a solder paste 145 (of the device die 130); the second lead frame portion 155b of at device die position 175 adheres to the carrier tape 120. The lead frame device die position 155 has a first bend 165a and a second bend 165b. A solder reflow process mechanically and electrically attaches the first portion (with the solder paste 145) of first portion of 155a the device die position 155 of lead frame 150 to the device die pad 140a. The array of device positions 155 are solder-reflow attached for the entire lead frame 150. An individual device view 200 of FIG. 1D shows, in more detail, the assembly. Note that a second lead frame portion at device position 155b' is part of an additional lead frame device position 155' (as shown by the dashed lines).

Information on solder paste printing and reflow soldering may be found in the publication, "SMT Notes for CHIP-R and MLCC" of Walsin Technology Corporation, Tao Yuan, Taiwan, pp. 21. Additional information may be found in the publication, "Comprehensive User's Guide: MLP Micro Leadframe Package," April 2002. Carsem, Inc. pp. 19. Also further information on surface mounting and solder reflow may be found in Application Note, AN10365 Rev. 6, 20 Jul. 2012, "Surface Mount Reflow Soldering," of NXP Semiconductors, pp. 31.

In another example embodiment, additional bond pads 140b on device die 130 may have wire bonds 160 connected to a second lead frame portion of the device die position 155b' of the lead frame 150'. Refer to device view 250 of FIG. 1E.

After the lead frame 150 connections and wire bonds 160, if done, have been defined for the array of device die positions, the device die 130 and lead frame 150 are encapsulated in a molding compound 170. Encapsulation may be accomplished with a map molding process in which the entire lead frame/device die array is entirely encapsulated in molding compound or encapsulation may be of individual device die 130 with a mold 170' consisting of Separate device locations 215. Refer to FIGS. 1F-1G and FIGS. 2F-2G.

Figure 3A:
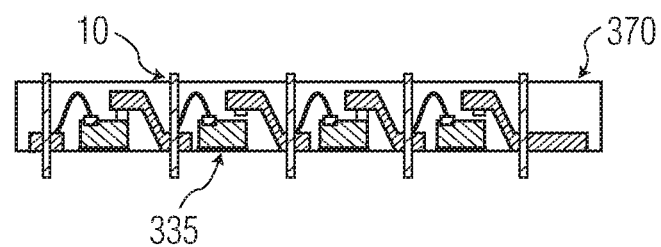
FIGS. 3A-3B are side-views of a package singulated by sawing.
Figure 3B:
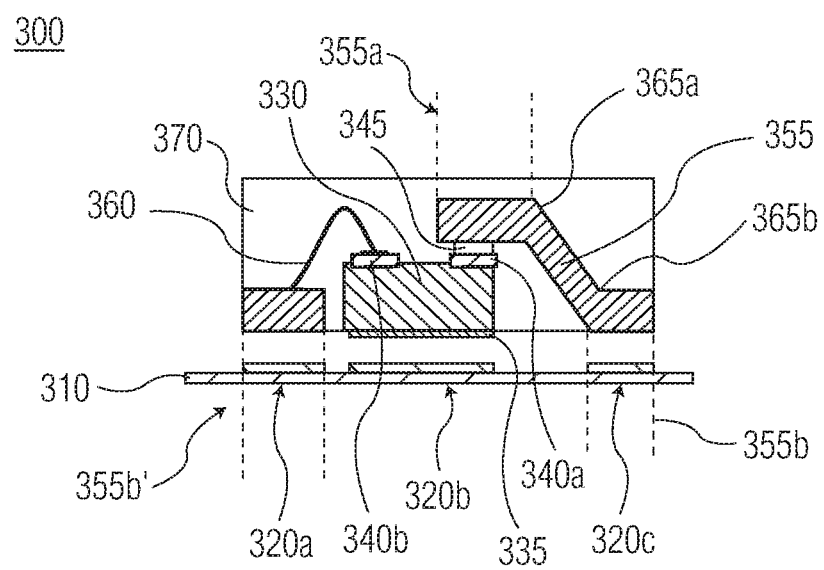

Refer to FIGS. 3A-3B depict packaged devices which have been separated by wafer sawing with a blade 10. Those devices encapsulated with a map molding process would be sawn apart at their predetermined package boundaries. In the instant disclosure, the sawing or cleaving apart of the device would be in the vicinity mid-way from the edge of the second lead frame portion 155b and the second bend 165b.

Refer to FIG. 3B. The finished IC device 300 has a device die 330 in a molding compound 370. One or more lead frame clips 365 through a solder/bond pad connections 340 electrically connect the device die 330 whose underside has solderable conductive material (back metal) 335 applied thereto. The lead frame clip 355 has an upper portion 355a and a lower first portion 355b; the lead frame clip 355 has an upper bend 365a and a lower bend 365b. Device 330 has additional bond pads 340b to which wires 360 are bonded. The bond wires 360 are bonded to the additional bond pad 340b and to a lower second portion 355b' of an additional set of lead frame clips (not illustrated) which had been cut during singulation. The undersides of the lower first portions 355b and second lower portions 355b' and the underside side of the device die 330, which has been coated with a solderable conductive material 335, are co-planar with one another. The finished IC device 300 has its device die 330 underside 335 and the lower first portion 355b and the lower second portion 355b' soldered to corresponding contact regions 320a, 320b, and 320c, on printed circuit board 310.

Figure 4A:
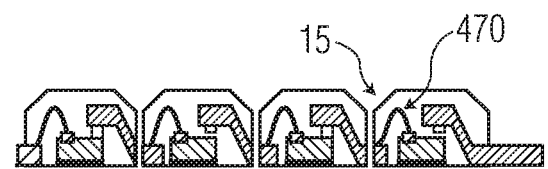
FIGS. 4A-4B are side-views of packaged devices singulated by punching.
Figure 4B:
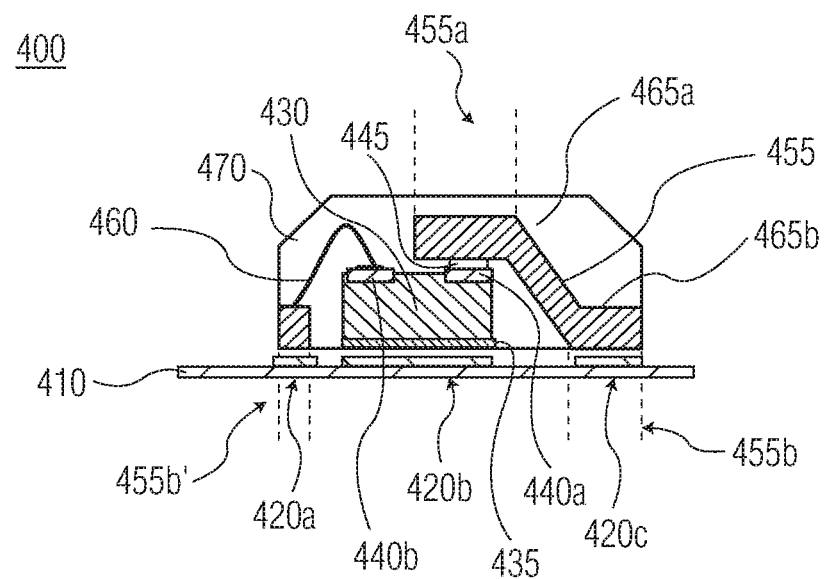

FIGS. 4A-4B depict packaged devices which had been separated by punch singulation 15. Punch singulation is appropriate for those devices encapsulated as individual device die during the molding process. After encapsulation, an apparatus having a plurality of cutting blades would cleave apart the packaged devices at predetermined package boundaries, as done with the saw cut of FIG. 3A-3B, in the vicinity mid-way from the edge of the second lead frame portion 455b and the second bend 465b. An example technique for punch singulation may be found in U.S. Patent Publication 2012/0184086 A1 (published Jul. 19, 2012) titled, "Punch Singulation System and Method," of Hae Choon Yang et al, and is incorporated by reference in its entirety.

As with the packaged device of FIG. 3B, the finished IC device 400 has a device die 430 in a molding compound 470 (See FIG. 4B). One or more lead frame clips 455 through a solder/bond pad connections 440 electrically connect the device die 430 whose underside has solderable conductive material 435 applied thereto. The lead frame clip 455 has an upper portion 455a and a lower first portion 455b; the lead frame clip 455 has an upper bend 465a and a lower bend 465b. Device 430 has additional bond pads 440b to which wires 460 are bonded. The bond wires 460 are bonded to a lower second portion 455b' of a second set of lead frame clips (not illustrated) which had been cut during singulation. The undersides of the lower first portions 455b and second lower portions 455b' and the underside side of the device die 430, which has been coated with a solderable conductive material 435, are co-planar with one another. The finished IC device 400 has its device die 430 underside and the lower first portion 455b and the lower second portion 455b' soldered to corresponding contact regions 420a, 420b, and 420c, on printed circuit board 410.

Figure 5:
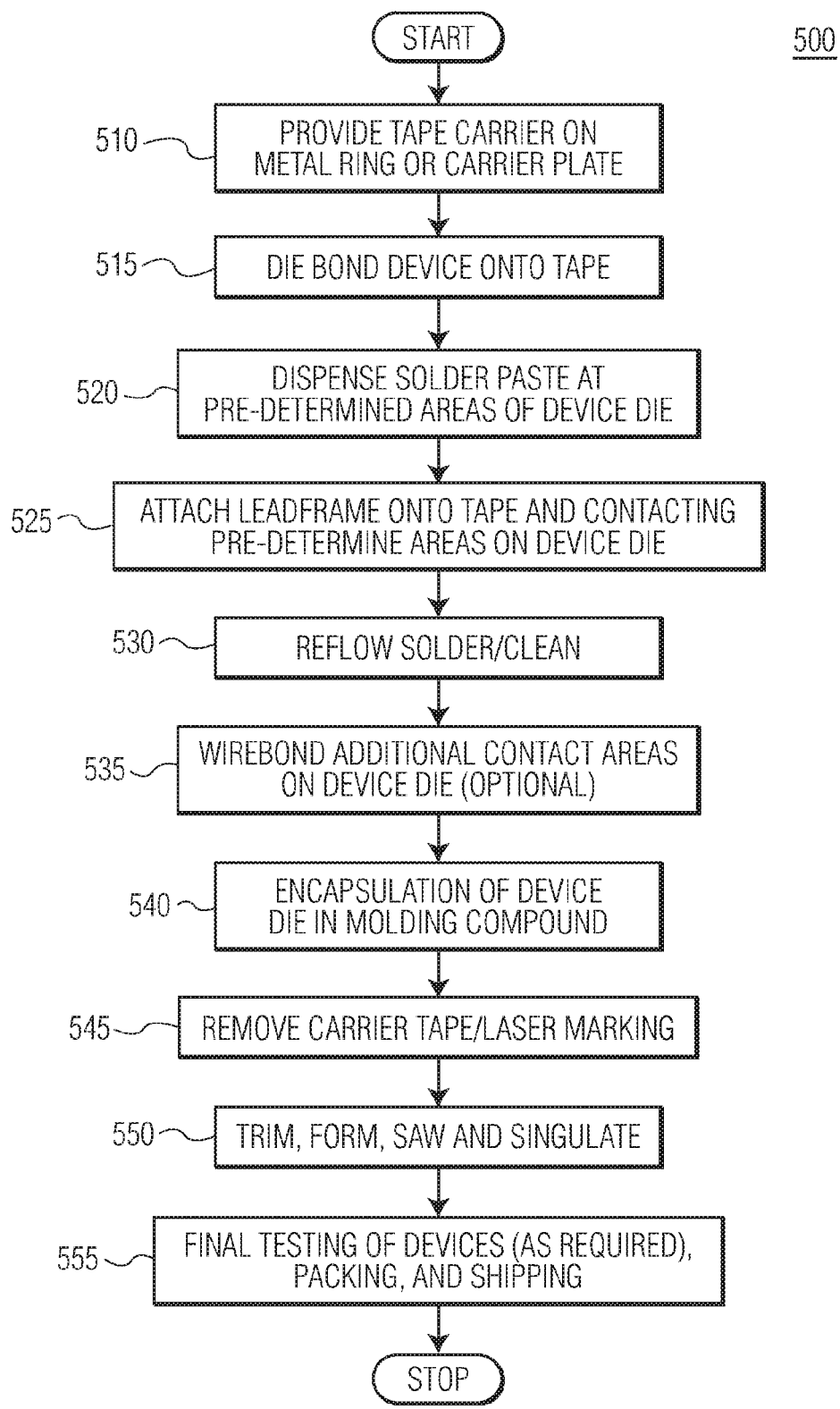
FIG. 5 is a flow diagram of an example process according to the disclosure.

In an example embodiment according to the present disclosure, an assembly process is shown. Refer. To FIG. 5. In a metal ring apparatus or other suitable carrier, carrier tape is mounted and stretched 510. Device die are bonded to the tape 515. These device die (at the wafer level) have had a solderable surface applied to the underside. At predetermined pad landings on the device die, a solder paste is applied 520. The predetermined bond pads upon which solder paste is applied through a screen process. The lead frame is mounted onto the tape and is positioned so that it is contacting those bond pads upon which solder paste has been applied 525. A reflow process melts the solder and at the bond pads, mechanically and electrically attaches the lead frame with the device die 530. If required, an additional cleaning may be performed. Refer back to FIG. 1E. An additional feature of wire bonding additional bond pads may be implemented 535. In an example package, the wire bond 160 may be attached from additional bond pads 140b to the surface of an adjacent second lead frame portion 155b'. Having completed the lead frame attach and wire bonding, the device die are encapsulated in a molding compound 540. In an example process, some molding compounds, may include, but not necessarily limited to, those manufactured by Sumitomo (e.g.: x84194) and Hitachi (e.g.: cel 400 ZHF 40 53 C), etc. After molding is completed, the carrier tape is removed 545, individual devices may be laser marked for identification purposes. In another example process, removal of the tape occur later in the process; the same tape might even be used for the saw singulation process. Depending upon the molding process, the devices may be singulated either by sawing with a diamond saw of a suitable kerf or cleaved apart via a punch apparatus 550. Burrs or rough edges on the individual encapsulated devices may be removed by suitable processes. These finished devices are electrically tested (as required), packed and shipped to the end user 555.

In another example embodiment, there may be a concern about material consumption in the discarding of scrap pieces of lead frame material after the device die are assembled. After placement of the device die 130 onto the carrier tape 120, the components of the lead frame 150 may be individual lead frame portions 155 placed on the carrier tape 120 and the upper portion 155a of the lead frame portion 150 contacts pre-determined bond pad landings 140 on device die 130, so as to establish an electrical connection. An example of this technique of using individual lead frame portions may be found in US Patent Application Publication (US2011/0198738 A1 published Aug. 18, 2011) of Peter Wilhelmus Maria Van De Water et al, titled, "Method for Manufacturing a Microelectronic Package Comprising at Least One Microelectronic Device," and is incorporated by reference in its entirety.

In another example embodiment FIGS. 6A-6J depict the assembly 600 of device die, as has been shown in reference to FIGS. 1A-1G. However, a temporary support plate 610 has been included to provide a precision surface upon which carrier tape 620 is applied. Device die 630, having a solderable underside coating 635, are laid on the support plate-backed carrier tape 620 based on carrier capacity, die size, number of pins to bond or attach to clips, etc. Solder paste is applied to die pads 640. The lead frame clips 650 are positioned over the die bond pads 640a and attached to the carrier tape 620. With solder reflow, the lead frame portions are electrically connected and mechanically anchored to the device die bond pads 640a. As required, for other device die bond pads 640b, bond wires 660 are attached. The assembly 600 undergoes encapsulation 670.

As with the afore-mentioned embodiment, the assembly may undergo map molding (FIGS. 6F-6G) and be sawed apart with a blade 90 between devices and their separate the lead frame portions, resulting in individual devices 680.

Figure 6A:
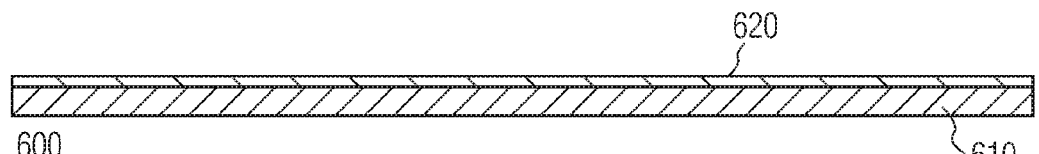
FIGS. 6A-6J depict side-views of device die assembled according to another embodiment of the present disclosure.
Figure 6B:
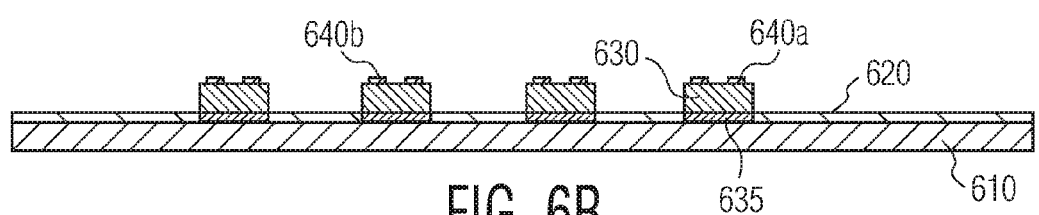
Figure 6C:
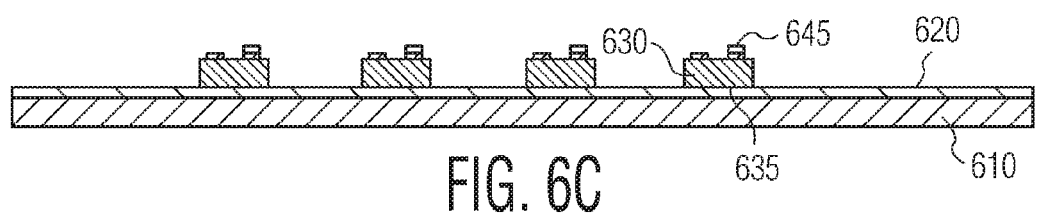
Figure 6D:
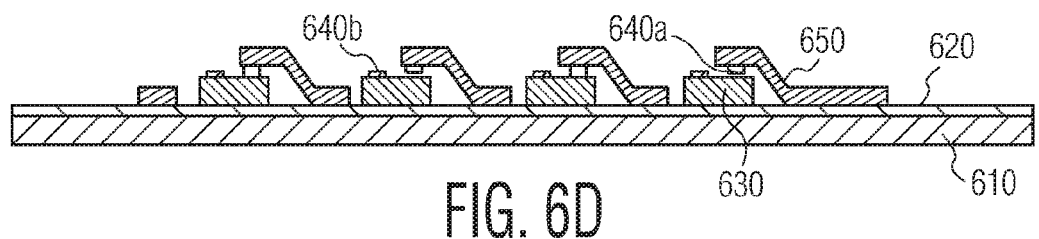
Figure 6E:
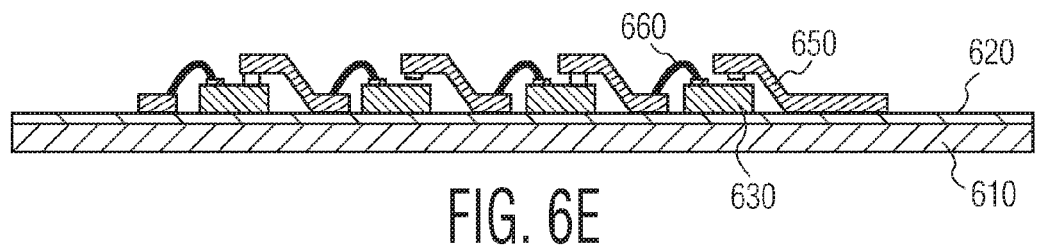
Figure 6F:
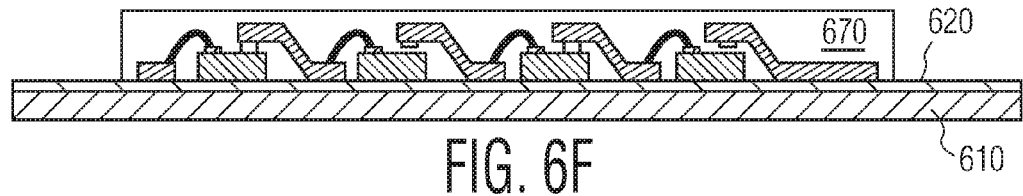
Figure 6G:
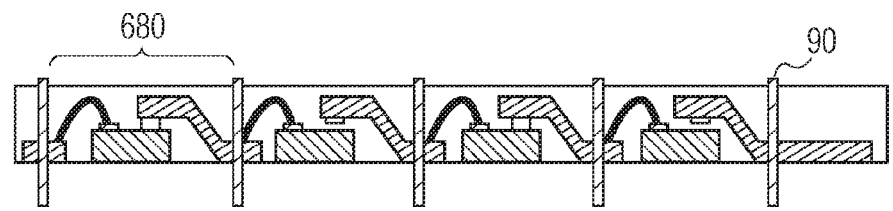
Figure 6H:
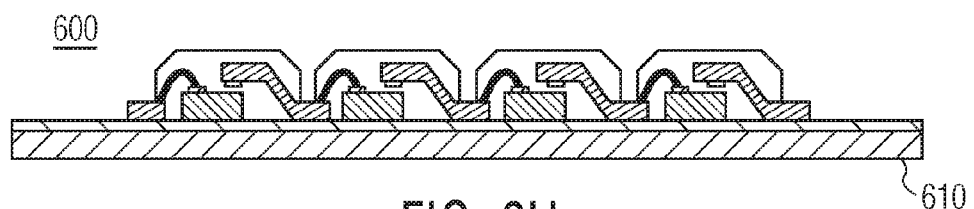
Figure 6I:
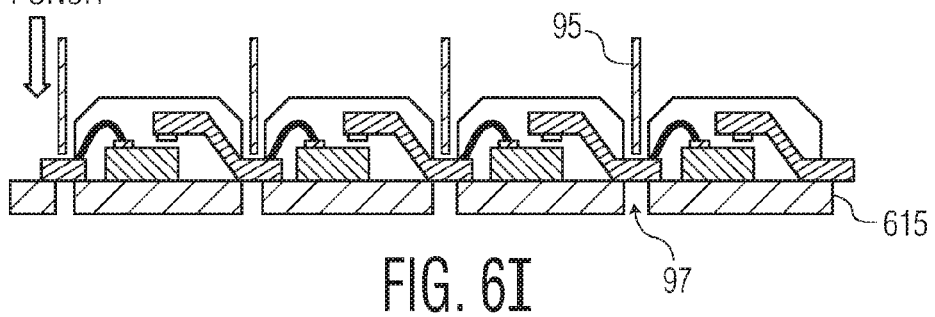
Figure 6J:
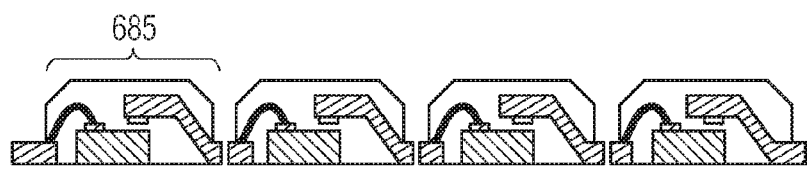

In an alternative process, the devices may be individually encapsulated (FIG. 6H-6J). The carrier plate 610 is removed. After removal of the carrier plate 610, the strip is fed into a punch/singulation tool where punch tool 95 and anvil 615, with slots 97, cleave apart the device die. As shown in FIG. 6I, individual devices 685 have been separated by the punching/cleaving process.

Depending upon the production process, there is a tradeoff in terms of saving materials v. throughput. Individual clip placement provides for material savings and accuracy (i.e., each clip targets a particular die, as it is placed thereon). Using a grid of clips saves time and increases throughput, however the placement accuracy is of tighter tolerances. In an example process, a combination of both techniques provides a reasonable compromise between material consumption and throughput, and placement accuracy. Lead frame strips of clips about 50 mm in width may be placed upon the arrayed device die.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. A method for packaging an integrated circuit (IC) device, the method comprising:
mounting a plurality of active device die, into predetermined positions, onto a temporary carrier, each said active device die having bond pads, each of said active device die having a solderable conductive surface on its underside; and having been subjected to back-grinding to a prescribed thickness;
dispensing a solder paste onto the bond pads on the plurality active device die;
attaching a lead frame to the temporary carrier, the lead frame having an array of device positions which correspond to the predetermined positions of the plurality of active device die, wherein upper lead frame portions contact the solder paste present on the bond pads and lower lead frame portions contact the temporary carrier; and
reflowing the solder so that a connection is made between the upper lead frame portions and the bond pads of the plurality of active device die.

2. The method as recited in claim 1, wherein the lead frame is comprised of two or more lead frame strips of clips.

3. The method as recited in claim 1, further comprising:
wire bonding from additional bond pads opposite the bond pads on each of the active device die to additional lower lead frame portions adjacent to the additional bond pads.

4. The method as recited in claim 1, further comprising:
encapsulating the plurality of active device die attached to the lead frame in a molding compound;
removing the temporary carrier; and
singulating the plurality of molded device die into individual devices.

5. The method as recited in claim 1, wherein the temporary carrier is at least one of the following:
a carrier tape stretched in a carrier ring apparatus;
a carrier tape attached to a support plate.

6. The method as recited in claim 1, wherein the solderable conductive surface includes: NiAu, Ni, Cu, Au, NiPdAu, AuSn, NiSn, CuSn, Ag, AgSn or alloys thereof.

7. A method for packaging an integrated circuit (IC) device from a semiconductor wafer substrate, the wafer substrate having a top-side surface with a plurality active device die defined thereon, and an under-side surface, the method comprising:
backgrinding the under-side surface of the wafer substrate to a prescribed thickness;
applying a solderable conductive surface to the under-side surface of the wafer substrate;
separating out the plurality active device die from the semiconductor wafer substrate, each of the active device die having bond pads, the bond pads providing electrical connection to circuit elements in the active device die;
mounting the plurality of active device die, into predetermined positions, onto a temporary carrier;
dispensing a solder paste onto the bond pads on the plurality active device die;
attaching individual lead frame portions to the temporary carrier and bond pads, wherein upper individual lead frame portions contact the solder paste present on the bond pads and lower individual lead frame portions contact the temporary carrier; and reflowing the solder so that a connection is made between the upper lead frame portions and the bond pads of the plurality of active device die.

8. The method as recited in claim 7, wherein the temporary carrier is at least one of the following:

a carrier tape stretched in a carrier ring apparatus;

a carrier tape attached to a support plate.

9. The method as recited in claim 8, further comprising:

wire bonding from additional bond pads opposite the bond pads on each of the active device die to additional lower individual lead frame portions adjacent to the additional bond pads.

10. The method as recited in claim 8, further comprising:

encapsulating the plurality of active device die attached to the lead frame in a molding compound;

removing the temporary carrier; and singulating the plurality of molded device die into individual devices.

* * * * *